(12) United States Patent
Nirmaier et al.

(10) Patent No.: US 7,865,795 B2
(45) Date of Patent: Jan. 4, 2011

(54) METHODS AND APPARATUSES FOR GENERATING A RANDOM SEQUENCE OF COMMANDS FOR A SEMICONDUCTOR DEVICE

(75) Inventors: Thomas Nirmaier, Munich (DE); Wolfgang Spirkl, Germering (DE)

(73) Assignee: Qimonda AG, Munich (DE)

( * ) Notice: Subject to any disclaimer, the term of this patent is extended or adjusted under 35 U.S.C. 154(b) by 387 days.

(21) Appl. No.: 12/039,292

(22) Filed: Feb. 28, 2008

(65) Prior Publication Data

US 2009/0222779 A1  Sep. 3, 2009

(51) Int. Cl.
G01R 31/28 (2006.01)
G06F 11/00 (2006.01)

(52) U.S. Cl. ............... 714/741; 714/21; 714/37; 714/39; 714/49; 714/51; 714/724; 714/728; 714/733; 714/734; 714/738; 714/739; 717/135; 703/3; 703/4; 703/14; 703/15; 703/19; 703/20; 703/21

(58) Field of Classification Search .............. None
See application file for complete search history.

(56) References Cited

U.S. PATENT DOCUMENTS

| | | | | |
|---|---|---|---|---|
| 4,500,993 | A * | 2/1985 | Jacobson | 714/734 |
| 6,011,830 | A * | 1/2000 | Sasin et al. | 379/10.03 |
| 7,613,599 | B2 * | 11/2009 | Bade et al. | 703/14 |
| 7,680,645 | B2 * | 3/2010 | Li et al. | 703/22 |
| 2004/0044508 | A1 * | 3/2004 | Hoffman, Jr. | 703/13 |

* cited by examiner

Primary Examiner—John P Trimmings
(74) Attorney, Agent, or Firm—Dicke, Billig & Czaja, PLLC

(57) ABSTRACT

Methods and apparatuses for generating a random sequence of commands for a semiconductor device. The method generates random state transitions within a finite state machine model of the semiconductor device. A sequence of commands is determined which are associated to the generated random state transitions based on the finite state machine model of the semiconductor device.

21 Claims, 5 Drawing Sheets

METHODS AND APPARATUSES FOR GENERATING A RANDOM SEQUENCE OF COMMANDS FOR A SEMICONDUCTOR DEVICE

BACKGROUND

The invention relates to methods and apparatuses for generating a random sequence of commands and a random pattern, respectively, for simulation and/or test of a semiconductor device, in one embodiment a memory device.

Semiconductor devices, e.g., integrated (analog or digital) computing circuits, semiconductor memory devices such as functional memory devices (PLAs, PALs, etc.) and table memory devices (e.g., ROMs or RAMs, in one embodiment SRAMs and DRAMs), etc. are subject to comprehensive tests in the course of their manufacturing process.

When testing semiconductor devices, "DC tests" and/or "AC tests" may, for instance, be used as test methods.

In a DC test, a voltage (or current) of particular, especially constant, intensity may, for instance, be applied to a connection of a semiconductor device to be tested, and then the intensity of resulting currents (or voltages) may be measured, in one embodiment it may be examined whether these currents (or voltages) range within predetermined, desired threshold values.

Contrary to this, in an AC test, voltages (or currents), varying in intensity, may, for instance, be applied to connections of a semiconductor device, in one embodiment test pattern signals ("patterns") by using which appropriate function tests may be performed at the respective semiconductor device.

Conventional function tests often use fault models for generating an appropriate test pattern. A fault model is a mathematical description of how a defect alters design behavior. A fault is said to be detected by a test pattern if, when applying the pattern to the design, any logic value observed at one or more of the circuit's primary outputs differs between the original design and the design with the fault. The pattern generating process for a targeted fault consists of two phases: fault activation and fault propagation. Fault activation establishes a signal value at the fault model site that is opposite of the value produced by the fault model. Fault propagation moves the resulting signal value, or fault effect, forward by sensitizing a path from the fault site to a primary output.

Fault models are widely applied in tests of fully logic semiconductor devices, such as microprocessors, for example. However, fault models can not be used for full-chip simulation and test of e.g., memory devices, in one embodiment SDRAMs (Synchronous Dynamic Random Access Memory), due to, for example, the mixture between full-custom blocks, manually designed blocks, the memory array and usage of asynchronous timings on a SDRAM.

One approach to test these memory devices is to program a test particularly adapted to the respective memory device. However, this method is very time-consuming and costly.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In accordance with one embodiment, there is provided a method of generating a random sequence of commands for simulation and/or test of a semiconductor device. The method includes: generating random state transitions within a finite state machine model of the semiconductor device, and determining a sequence of commands which are associated to the generated random state transitions based on the finite state machine model of the semiconductor device.

In accordance with one embodiment, there is provided an apparatus for generating a random sequence of commands for simulation and/or test of a semiconductor device. The apparatus is configured to generate random state transitions within a finite state machine model of the semiconductor device, and determine a sequence of commands which are associated to the generated random state transitions based on the finite state machine model of the semiconductor device.

Further features, aspects and advantages of the present invention will become apparent from the following detailed description of the invention made with reference to the accompanying drawings.

Figure 1:
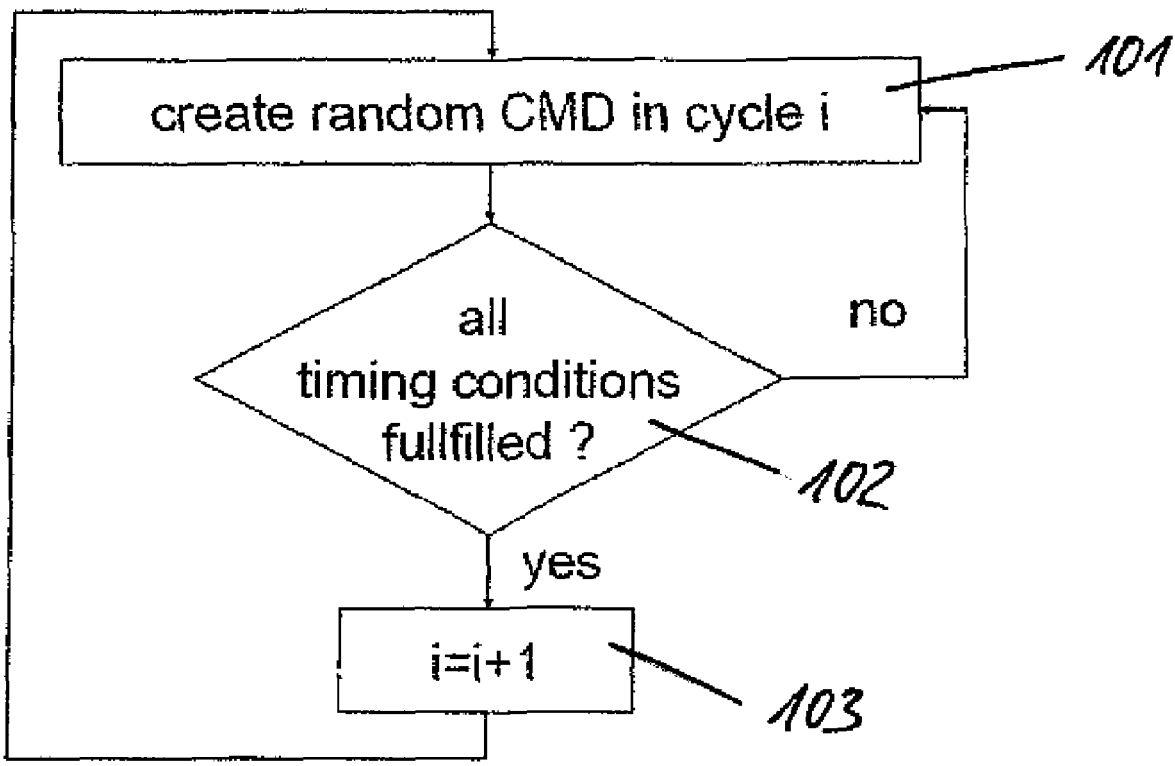
FIG. 1 illustrates a schematic simplified flowchart illustrating an algorithm for generating a random pattern.

The flowchart of FIG. 1 illustrates an algorithm for generating a random pattern for a test or simulation of a device, in one embodiment a memory device. The illustrated algorithm works on a cycle-basis with rules derived from the specification of the device.

At 101, a random command is generated for one cycle, e.g., cycle i, in the pattern, wherein i=1, . . . ,n, n being the total number of cycles. Then, in process 102, all rules and timing conditions contained in the specification for the generated command are checked, when the command is applied to cycle i. In other words, it is determined whether the (randomly) generated command is permitted in the particular state and at the particular time.

If at least one rule or condition is violated the algorithm returns to process 101, i.e. a new random command is generated for the cycle i and then again, in process 102, rules and timing conditions for the newly generated command are checked.

If no rule/condition is violated the cycle number i is increased by one, in process 103, and the algorithm starts anew with process 101, i.e. a further random command is generated for the new cycle i+1.

Figure 2:
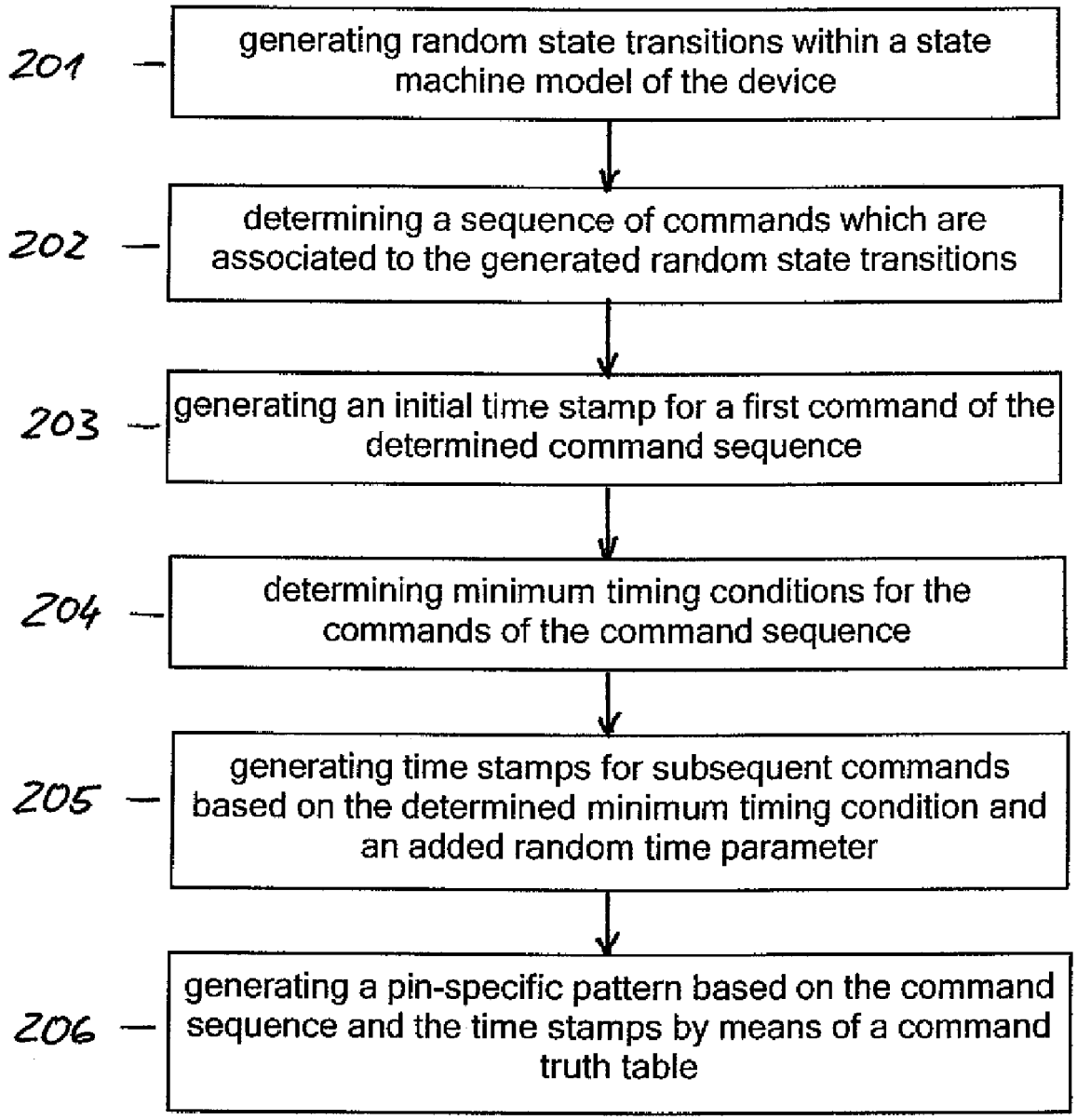
FIG. 2 illustrates a schematic simplified flowchart illustrating a method for generating a random pattern for simulation and/or test of a semiconductor device in accordance with one embodiment.

FIG. 2 illustrates a schematic simplified flowchart illustrating a method for generating a random pattern for simulation and test of a semiconductor device, in one embodiment a memory device, in accordance with one embodiment.

In contrast to the algorithm described before this method is a top-down approach. The method uses a finite state machine model (also referred to as "behavioral model") of the e.g., memory device. A finite state model of a device may be a list of states the device can occupy together with a list of possible transitions between these states. As the finite state model of the device inherently includes the whole plurality of rules and timing conditions of the specification of the respective device, state transitions within the behavioral model are always, i.e. by definition, permitted, provided that the model is consistent.

According to one embodiment, a Verilog model provided for system design and/or for the customer may be used. This is not mandatory, however, as "stand-alone" behavioral models represented by a state-transition table may be also used.

Starting at the top of FIG. 2 with process 201, random state transitions are generated within the chosen state machine model. An exemplary embodiment of a state-transition randomizer will be described in detail with reference to FIG. 4.

In process 202, a random sequence of commands to the (randomly) generated state transitions is determined. As each state transition is effected by an associated command, a valid command sequence will be obtained provided that the chosen behavioral model is consistent.

In the following processes, 203-205, a specification-conform timing is generated.

An initial time stamp for a first command of the determined command sequence is determined in process 203.

In process 204, minimum timing conditions for each command of the command sequence are determined, for example by using a command-to-command delay matrix including the minimum required time intervals between commands.

Then, in process 205, time stamps are generated for each command (apart from the first one) of the command sequence based on the determined minimum timing conditions, wherein a sort of random time interval may be added. Determination of the minimum timing conditions and generation of the timing for command sequences will be exemplarily described below in more detail with reference to FIG. 5.

In process 206, a pin-specific pattern is generated based on the sequence of commands and the associated time stamps. The generated pin-specific pattern includes pin-specific information for each command of the command sequence, i.e. specifies which signal level has to be applied to which pins during which time for the respective command. The pin-specific information for a command can be extracted from the product description or data sheet of the device, respectively, and is generally provided as a command truth table. A command truth table provides a sort of code for each command, including signal levels for input and output pins and the time intervals during which the signal levels are to be applied to the respective pins to issue the respective command.

These pin-specific random patterns may then be used for simulation and/or test of a semiconductor device, in one embodiment a memory device. An Automatic Test Equipment (ATE) may be used for testing the (memory) device.

Further, "disturbing" random operations may be generated and added to the pin-specific pattern, which means, certain signal levels are to be applied to pins which are not activated, but are in the "don't care" state. This modification of the pin-specific pattern may be used to e.g., simulate switching operations between different chips in memory modules when testing or simulating a memory module, for example.

According to one embodiment, the method for generating a random pattern for simulation and/or test of a semiconductor device, in one embodiment a memory device, includes generation of random data topologies.

For this purpose, a memory model of the memory device is used for generating "expected" data values. Out of all possible data topologies (or a subset therefrom) during a write command a random combination is chosen and written into the memory model. Thus, the memory model is used to generate "expected" data values for read commands.

For a test of a "physical" memory device, the same random combination is written into both the memory device and the memory model, read out from the respective memory locations, and the result is checked, i.e. the data obtained from the "physical" memory device is compared with the "expected" data obtained from the memory model, for example, by using an Automatic Test Equipment (ATE).

In the context of the random pattern generation, however, it is not intended to carry out a test of all memory locations of the memory device. Rather, random or spot tests should be carried out, wherein, e.g., for a SDRAM, at least one memory location may be tested in each memory bank, memory row, and memory column.

Figure 3:
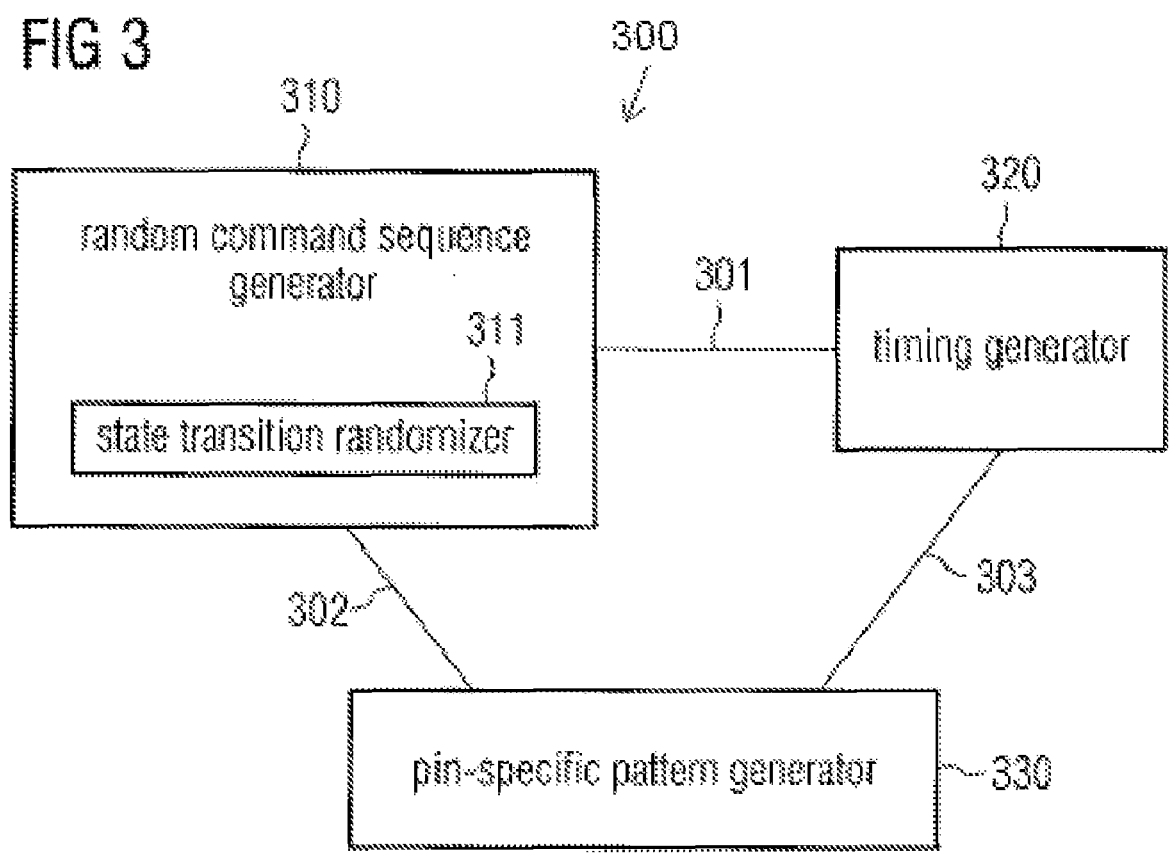
FIG. 3 illustrates a schematic diagram of a random pattern generator according to one embodiment.

FIG. 3 illustrates a schematic diagram of a random pattern generator according to one embodiment.

The random pattern generator 300 includes a random command sequence generator 310 having a state transition randomizer 311, a timing generator 320, and a pin-specific pattern generator 330.

The random command sequence generator 310 is connected to the timing generator 320 via connection 301 and to the pin-specific pattern generator 330 via connection 302. The timing generator 320 is connected to the pin-specific pattern generator 330 via connection 303.

The state transition randomizer 311 of the random command sequence generator 310 generates random state transitions within a state machine model of a semiconductor device. Operation of the state randomizer 311 will be described below in detail with reference to FIG. 4.

The random command sequence generator 310 then determines a command sequence which effects the state transitions generated by the state transition randomizer 311.

The timing generator 320 receives the command sequence from the random command sequence generator 310, determines minimum timing conditions for the commands, and generates time stamps based upon the determined minimum timing conditions. Operation of the timing generator 320 will be described below in detail with reference to FIG. 5.

The pin-specific pattern generator 330 receives the random command sequence from the random command sequence generator 310 via connection 302 and the associated time stamps from the timing generator 320 via connection 303.

Based on the received command sequence and the associated time stamps, the pin-specific pattern generator 330 generates a pin-specific pattern, for example by using a command truth table. The generated pin-specific pattern includes pin-specific information for each command of the command sequence, i.e. specifies which signal level has to be applied to which pins during which time for executing the respective command.

Figure 4:
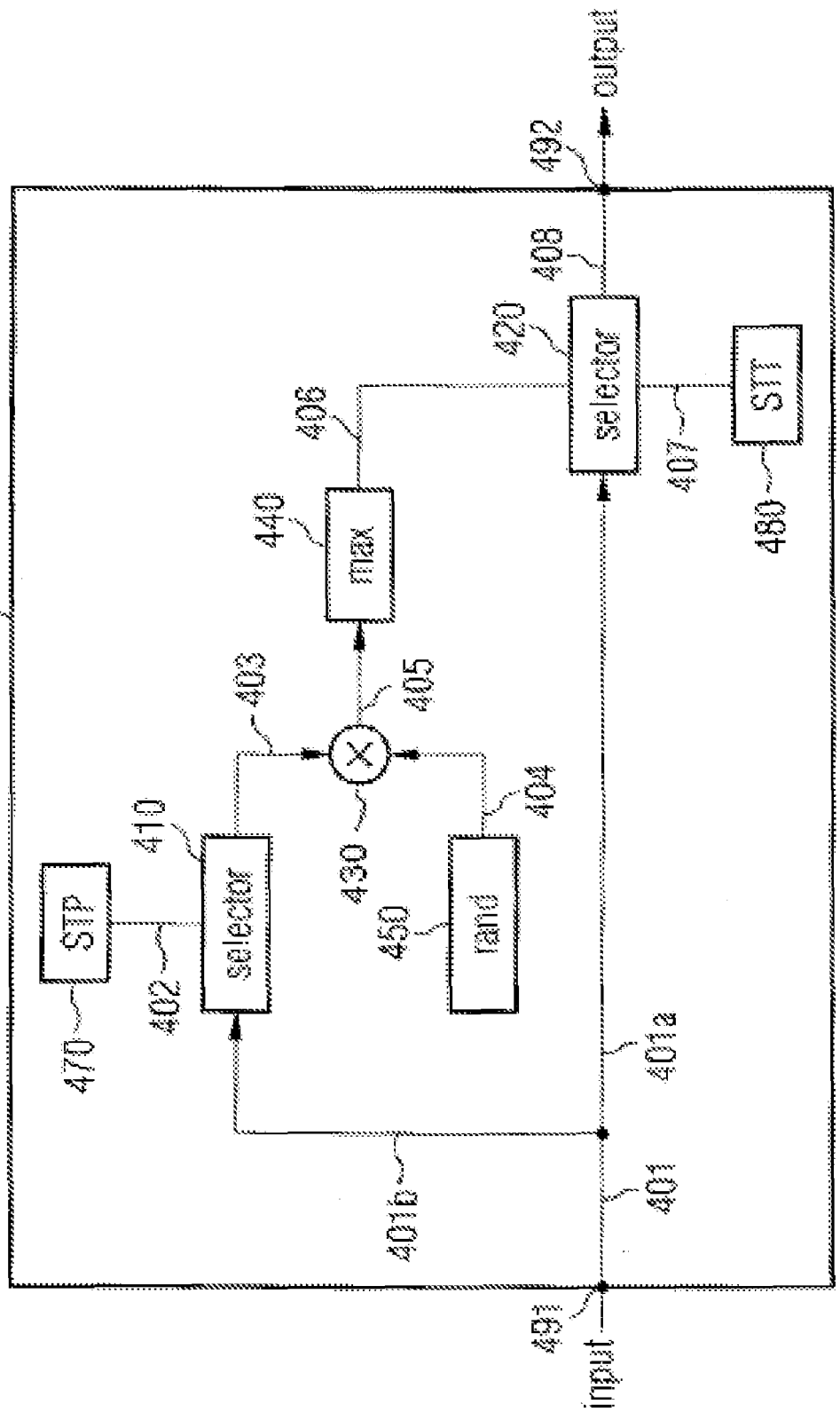
FIG. 4 illustrates a schematic diagram of one embodiment of the state-transition randomizer of the random pattern generator illustrated in FIG. 3.

FIG. 4 illustrates a schematic diagram of one embodiment of the state transition randomizer 311 of the random pattern generator 300 illustrated in FIG. 3.

The state transition randomizer 311 includes an input 491, an output 492, a first selector 410, a second selector 420, a multiplier 430, a maximizer element 440, a random number generator 450, a state transition probability matrix 470, and state transition table 480.

The input 491 is connected to the first selector 410 via connections 401 and 401b and is connected to the second selector 420 via connections 401 and 401a. The first selector 410 is further connected to the state transition probability matrix 470 via connection 402 and to the multiplier 430 via connection 403. The multiplier 430 is further connected to the random number generator 450 via connection 404 and to the maximizer element 440 via connection 405. The maximizer element 440 is further connected to the second selector 420 via connection 406. The second selector 420 is further connected to state transition table 480 via connection 407 and to the output 492 via connection 408.

The state randomizer 311 receives a previous state, state (p−1), at input 491 and outputs a new state, state p, at output 492, wherein p is a natural number and represents an index of the respective state.

The first selector 410 receives the previous state from input 491 via connections 401 and 401b at its first input and the state transition probability matrix 470 at its second input.

The state transition probability matrix 470 includes n rows, n being the number of commands in the used state machine model, and m columns, m being the number of possible states within the used state machine model. Element $a_{i,j}$ of the state transition probability matrix 470 includes a probability for the command i to be executed in the state j. Thus, provided that not all elements of a column j (to the state j) are identical, execution of different commands is variably probable. Accordingly, the state transition probability matrix 470 includes a weighted distribution of probabilities for the different commands to be executed in the different states. If an execution of a certain command is forbidden for a certain state the element of state transition probability matrix 470 is defined as 0.

The first selector 410 selects the column which corresponds to the state (p−1), i.e. selects the column which includes probabilities for each command to be issued in the state (p−1). This column can be considered as a vector having n components containing the probability for issuing each of the n commands, respectively.

The random number generator 450 generates a vector having n components, each containing a random number.

The multiplier 430 receives as a first input the selected column or vector, respectively, from selector 403 via connection 403 and receives as a second input the vector from the random number generator 450 via connection 404. The multiplier 430 multiplies the two received vectors component-wise, i.e. it multiplies the first component of the first vector with the first component of the second vector, the second component of the first vector with the second component of the second vector and so on. Accordingly, the multiplier outputs a vector having n components including probabilities for issuing each of the n commands.

The maximizer element 440 receives the vector from the multiplier 430 via connection 405, determines the component containing the highest number or probability, respectively, and outputs the index of the component containing the highest number. This index specifies a certain command according to the indexing of the state transition probability matrix 470.

The second selector 420 receives as first input the index representing a certain command from the maximizer element 440 via connection 406, and receives as second input the previous state, state (p−1) from the input 491, and as a third input the state transition table 480 via connection 407.

The state transition table 480 specifies for a previous state and a command to be executed the state to which the device will transition. For example, the state transition table 480 may be a matrix of the same dimension as state transition probability matrix 470 (n rows to n commands and m columns to m states), wherein matrix element $b_{i,j}$ specifies a state to which the device will transition from previous state j when command i is executed.

Based on the received inputs, the previous state (p−1) and the command to be executed, the second selector 420 selects the matrix element of the state transition matrix 480 containing the state (p) to which the device will transition from state (p−1) when the command is executed. The second selector 420 outputs the new state (p) to the output 492.

Figure 5:
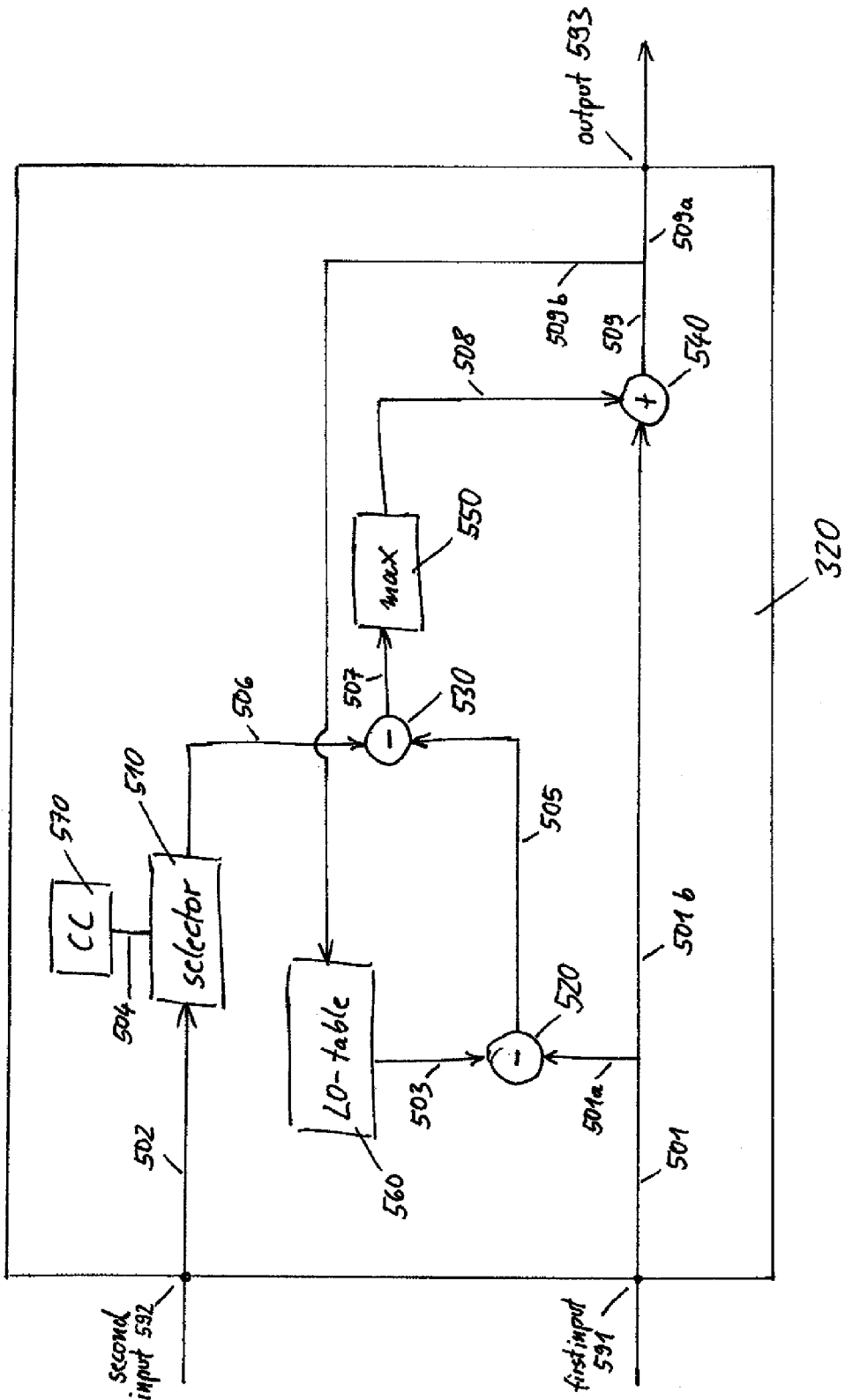
FIG. 5 illustrates a schematic diagram of one embodiment of the timing generator of the random pattern generator illustrated in FIG. 3.

FIG. 5 illustrates a schematic diagram of one embodiment of the timing generator 320 of the random pattern generator 300 illustrated in FIG. 3.

The timing generator 320 includes a first input 591, a second input 592, an output 593, a selector 510, a first subtracter 520, a second subtracter 530, an adder 540, a maximizer element 550, a table 560 containing times of last occurrence for each command, hereinafter referred to as "LO-table", and a command-to-command delay matrix 570.

The timing generator 320 receives the time, t(p−1), of execution of a previous command, cmd(p−1), at its first input 591 and an index number specifying the new command, cmd (p), at its second input 592 and outputs the time, t(p), for execution of the new command, cmd(p).

The first subtracter 520 is connected to the first input via connections 501 and 501a, to the LO-table 560 via connection 503 and to the second subtracter via connection 505. The selector 510 is connected to the second input 592 via connection 502, to the command-to-command delay matrix 570 via connection 504 and to the second subtracter 530 via connection 506. The second subtracter 530 is further connected to the maximizer element 550 via connection 507. The maximizer element 550 is further connected to the adder 540 via connection 508, and the adder 540 is further connected to the first input 591 via connections 501 and 501b, the output 593 via connections 509 and 509a, and the LO-table 560 via connections 509 and 509b.

The LO-table 560 includes a vector having n components specifying the time of last occurrence or execution, respectively, for the n commands of the used state machine model for the device.

The first subtracter 520 receives the vector from the LO-table 560 and the time, t(p−1,) of execution of the previous command, cmd(p−1), from the input 591, subtracts the time, t(p−1), from each component of the vector, and forwards the result to the second subtracter 530. The result or output of the first subtracter 520 represents a vector with the time intervals respectively lying between the execution of the previous command, cmd(p−1), and the last execution of each command of the n commands.

The command-to-command delay matrix 570 is a quadratic (n×n) matrix whose elements specify the minimum required time interval between execution of two commands. For example, the first column of the matrix contains the n time intervals which have to lie between the execution of the command with index 1, for example a read command, and the respective time of last occurence of each of the n commands.

The selector 510 receives the index of the new command, cmd(p,)from the input 592, selects the column of the command-to-command delay matrix 570 having the received index and forwards the selected column to the second subtracter 530.

The second subtracter 530 subtracts (meant is the scalar subtraction of vectors) the vector received from the first subtracter 520 from the vector received from the selector 510 and forwards the result to the maximizer element 550. Components of the resulting vector including numbers which are less than or equal to 0 indicate that, with the regard to the respective command, the minimum required time interval has already elapsed. In contrast, vector components including positive numbers, indicate that the timing condition for the respective command has not been met yet, i.e. the respective minimum required time interval has not elapsed yet.

The maximizer element 550 receives the vector from the second subtracter 530 and forwards the component including the highest number, i.e. the longest time interval, dt, to the adder 540. By taking the maximum time interval, dt, it is guaranteed that the timing conditions with regard to all commands are met.

The adder 540 receives the time, t(p−1), of execution of the previous command, cmd(p−1), from the first input 591 and the longest time interval, dt, from the maximizer element 550 and adds the time interval, dt, to the time, t(p−1), to obtain the time, t(p), when the new command, cmd(p), is to be issued.

In one embodiment (not illustrated), the adder may not only add the time interval, dt, but may additionally add a random time interval, dRt, to the time, t(p−1). Thus, a command sequence is not only simulated and/or tested with minimum time intervals, but also with longer time intervals as mandatory for meeting the minimum timing conditions.

In one embodiment (notillustrated), the adder may not only add the time interval, dt, but may additionally add a quasi random time interval, dRt, to the time, t(p−1),. In this case, the values for the quasi random time interval, dRt, include a decreasing probability distribution, i.e. the probability for a time interval to be chosen decreases with increasing length of the time interval. In other words, commands are e.g., provided with such time intervals, dt+dRt, in between, which are close to the minimum time intervals (dRt being rather small).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of generating a random sequence of commands for a semiconductor device, the method comprising:
   generating, via a computer, random state transitions within a finite state machine model of the semiconductor device;
   determining, via the computer, a sequence of commands which are associated to the generated random state transitions based on the finite state machine model of the semiconductor device;
   determining, via the computer, minimum timing conditions for the commands of the sequence of commands; and
   generating, via the computer, time stamps for the commands of the sequence of commands based on the determined minimum timing conditions.

2. The method of claim 1, comprising determining the minimum timing conditions using a command-to-command delay table.

3. The method of claim 1, comprising generating the random state transitions using at least one of a state transition table and a state transition probability table.

4. A method of generating a random pattern for at least one of simulation and test of a semiconductor device, the method comprising:
   generating, via a computer, random state transitions within a state machine model of the semiconductor device;
   determining, via the computer, a sequence of commands which are associated to the generated random state transitions based on the state machine model of the semiconductor device;
   determining, via the computer, minimum timing conditions for the commands of the sequence of commands;
   generating, via the computer, timings for the commands of the sequence of commands based on the determined minimum timing conditions; and
   generating, via the computer, a pin-specific pattern based on the sequence of commands and the timings for the commands of the sequence of commands by using a command truth table.

5. The method of claim 4, comprising generating the random state transitions using at least one of a state transition table and a state transition probability table.

6. The method of claim 5, further comprising:
   modifying the pin-specific-pattern such that, additionally, signal levels are applied to non-activated pins when at least one of testing and simulating the semiconductor device.

7. The method of claim 4, comprising determining the minimum timing conditions using a command-to-command delay table.

8. The method of claim 4, comprising determining the timings for the commands of the sequence of commands based on the determined minimum timing conditions for the commands of the sequence of commands and additional random time intervals.

9. The method of claim 8, wherein the additional random time intervals comprise a decreasing probability distribution.

10. The method of claim 4, further comprising:
    generating random data topologies for a memory test of the semiconductor device.

11. A physical computer program product used for storing instructions for generating a random sequence of commands for at least one of simulation and test of a semiconductor device, wherein the computer program product instructions causes the following actions when executed on a computer:
    generating random state transitions within a finite state machine model of the semiconductor device;
    determining a sequence of commands which are associated to the generated random state transitions based on the finite state machine model of the semiconductor device;
    determining minimum timing conditions for the commands of the sequence of Commands; and generating time stamps for the commands of the sequence of commands based on the determined minimum timing conditions.

12. The computer program product of claim 11, wherein the computer program product instructions further causes the following action when executed on a computer:

generating a pin-specific pattern based on the sequence of commands and the time stamps for the commands of the sequence of commands by using a command truth table.

13. An apparatus comprising:

a sequence generator configured to generate random state transitions within a finite state machine model of a semiconductor device;

a timing generator configured to determine a sequence of commands which are associated to the generated random state transitions based on the finite state machine model of the semiconductor device;

wherein the apparatus is further configured to determine minimum timing conditions for the commands of the sequence of commands; and wherein the apparatus is further configured to determine the minimum timing conditions by using a command-to-command delay table.

14. The apparatus of claim 13, wherein the apparatus is further configured to generate the random state transitions by using at least one of a state transition table and a state transition probability table.

15. The apparatus of claim 13, wherein the apparatus is adapted to generate a random sequence of commands for at least one of simulation and test of a semiconductor device.

16. An apparatus comprising:

a sequence generator configured to generate random state transitions within a finite state machine model of a semiconductor device;

a timing generator configured to determine a sequence of commands which are associated to the generated random state transitions based on the finite state machine model of the semiconductor device;

wherein the apparatus is further configured to determine minimum timing conditions for the commands of the sequence of commands; and wherein the apparatus is further configured to generate time stamps for the commands of the sequence of commands based on the determined minimum timing conditions.

17. The apparatus of claim 16, wherein the apparatus is further configured to generate the random state transitions by using at least one of a state transition table and a state transition probability table.

18. The apparatus of claim 16, wherein the apparatus is adapted to generate a random sequence of commands for at least one of simulation and test of a semiconductor device.

19. An apparatus comprising:

a random command sequence generator configured to generate random state transitions within a state machine model of a semiconductor device and determine a sequence of commands which are associated to the generated random state transitions;

a timing generator configured to determine minimum timing conditions for the commands of the sequence of commands and generate timings for the commands based on the minimum timing conditions of the commands; and a pin-specific pattern generator configured to generate a pin-specific pattern based on the sequence of commands and the timings using a command truth table.

20. The apparatus of claim 19, wherein the apparatus is further configured to generate the random state transitions by using at least one of a state transition table and a state transition probability table.

21. The apparatus of claim 19, wherein the apparatus is further configured to determine the minimum timing conditions by using a command-to-command delay table, configured to generate a random pattern for at least one of simulation and test of a semiconductor device, and configured to generate a random sequence of commands for at least one of simulation and test of the semiconductor device.

* * * * *